United States Patent
Hirler et al.

(10) Patent No.: US 9,704,984 B2
(45) Date of Patent: Jul. 11, 2017

(54) SUPER-JUNCTION SEMICONDUCTOR DEVICE COMPRISING JUNCTION TERMINATION EXTENSION STRUCTURE AND METHOD OF MANUFACTURING

(71) Applicant: Infineon Technologies Austria AG, Villach (AT)

(72) Inventors: Franz Hirler, Isen (DE); Daniel Tutuc, St. Niklas an der Drau (AT); Andreas Voerckel, Finkenstein (AT); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/139,664

(22) Filed: Apr. 27, 2016

(65) Prior Publication Data

US 2016/0322490 A1      Nov. 3, 2016

(30) Foreign Application Priority Data

Apr. 29, 2015   (DE) ........................ 10 2015 106 693

(51) Int. Cl.
| | |
|---|---|
| *H01L 29/78* | (2006.01) |
| *H01L 29/417* | (2006.01) |
| *H01L 29/167* | (2006.01) |
| *H01L 21/266* | (2006.01) |
| *H01L 29/06* | (2006.01) |
| *H01L 29/66* | (2006.01) |

(52) U.S. Cl.
CPC ...... *H01L 29/7811* (2013.01); *H01L 29/0615* (2013.01); *H01L 29/0619* (2013.01); *H01L 29/0634* (2013.01); *H01L 29/66712* (2013.01)

(58) Field of Classification Search
CPC .......... H01L 29/66712; H01L 29/0615; H01L 29/0634
See application file for complete search history.

(56) References Cited

U.S. PATENT DOCUMENTS

| | | | |
|---|---|---|---|
| 2006/0033153 A1 | 2/2006 | Onishi et al. | |
| 2007/0138543 A1* | 6/2007 | Saito ................... | H01L 29/0634 257/328 |
| 2009/0286372 A1 | 11/2009 | de Frésart et al. | |
| 2011/0204442 A1* | 8/2011 | Guan .................. | H01L 29/0634 257/342 |
| 2012/0248566 A1 | 10/2012 | Bobde et al. | |
| 2012/0258566 A1 | 10/2012 | Nishitani et al. | |

* cited by examiner

*Primary Examiner* — Caleb Henry
*Assistant Examiner* — Mounir Amer
(74) *Attorney, Agent, or Firm* — Murphy, Bilak & Homiller, PLLC

(57) ABSTRACT

A super-junction semiconductor device includes a junction termination area at a first surface of a semiconductor body and at least partly surrounding an active cell area. An inner part of the junction termination area is arranged between an outer part of the junction termination area and the active cell area. A charge compensation device structure includes first regions of a first conductivity type and second regions of a second conductivity type disposed alternately along a first lateral direction. First surface areas correspond to a projection of the first regions onto the first surface, and second surface areas correspond to a projection of the second regions onto the first surface. The super-junction semiconductor device further includes at least one of a first junction termination extension structure and a second junction termination extension structure.

15 Claims, 10 Drawing Sheets

US 9,704,984 B2

SUPER-JUNCTION SEMICONDUCTOR DEVICE COMPRISING JUNCTION TERMINATION EXTENSION STRUCTURE AND METHOD OF MANUFACTURING

PRIORITY CLAIM

This application claims priority to German Patent Application No. 10 2015 106 693.9 filed on 29 Apr. 2015, the content of said application incorporated herein by reference in its entirety.

BACKGROUND

Semiconductor devices known as charge compensation or super-junction (SJ) semiconductor devices, for example SJ insulated gate field effect transistors (SJ IGFETs) are based on mutual space charge compensation of n- and p-doped regions in a semiconductor substrate allowing for an improved trade-off between area-specific on-state resistance Ron×A and breakdown voltage Vbr between load terminals such as source and drain. Performance of charge compensation of SJ semiconductor devices depends on a lateral or horizontal charge balance between the n-doped and p-doped regions. Pn-junctions between load terminals, for example between a drift zone and a body region are curved in an edge area of the SJ semiconductor device at a main surface. Peak electric fields typically occur in the edge area. Since the breakdown voltage Vbr is closely related to the maximum electric field, areas of increased electric field typically limit a voltage blocking capability of power semiconductor devices.

It is desirable to improve the voltage blocking capability of a SJ semiconductor device in an edge area.

SUMMARY

The present disclosure relates to a super-junction semiconductor device comprising a junction termination area at a first surface of a semiconductor body and at least partly surrounding an active cell area. An inner part of the junction termination area is arranged between an outer part of the junction termination area and the active area. A charge compensation device structure comprising first regions of a first conductivity type and second regions of a second conductivity type is disposed alternately along a first lateral direction. First surface areas correspond to a projection of the first regions onto the first surface, and second surface areas correspond to a projection of the second regions onto the first surface. The super-junction semiconductor device further comprises at least one of a first junction termination extension structure and a second junction termination extension structure. First dopants of the first conductivity type constitute the first junction termination extension structure. In the outer part of the junction termination area, a projection area of the first junction termination extension structure onto the first surface is at least partly included in the second surface areas and is at least partly excluded from the first surface areas. Second dopants of the second conductivity type constitute the second junction termination extension structure. In the inner part of the junction termination area, a projection area of the second junction termination extension structure onto the first surface is at least partly included in the first surface areas and is at least partly excluded from the second surface areas.

The present disclosure also relates to a method of forming a super-junction semiconductor device. The method comprises forming a charge compensation device structure in a semiconductor body. The charge compensation device structure comprises first regions of the first conductivity type and second regions of the second conductivity type disposed alternately along a first lateral direction. First surface areas correspond to a projection of the first regions onto the first surface. Second surface areas correspond to a projection of the second regions onto the first surface. A first mask is formed on the first surface. The first mask at least partly exposes the second surface areas and at least partly covers the first surface areas in an outer part of a junction termination area at least partly surrounding an active cell area. Dopants of the first conductivity type are introduced into the semiconductor body through the at least partly exposed second surface areas.

The present disclosure also relates to another method of forming a super-junction semiconductor device. The method comprises forming a charge compensation device structure in a semiconductor body. The charge compensation device structure comprises first regions of the first conductivity type and second regions of the second conductivity type disposed alternately along a first lateral direction. First surface areas correspond to a projection of the first regions onto the first surface. Second surface areas correspond to a projection of the second regions onto the first surface. A second mask is formed on the first surface. The second mask at least partly exposes the first surface areas and at least partly covers the second surface areas in an inner part of a junction termination area between the outer part and an active cell area. Dopants of the second conductivity type are introduced into the semiconductor body through the at least partly exposed first surface areas.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

Figure 1A:
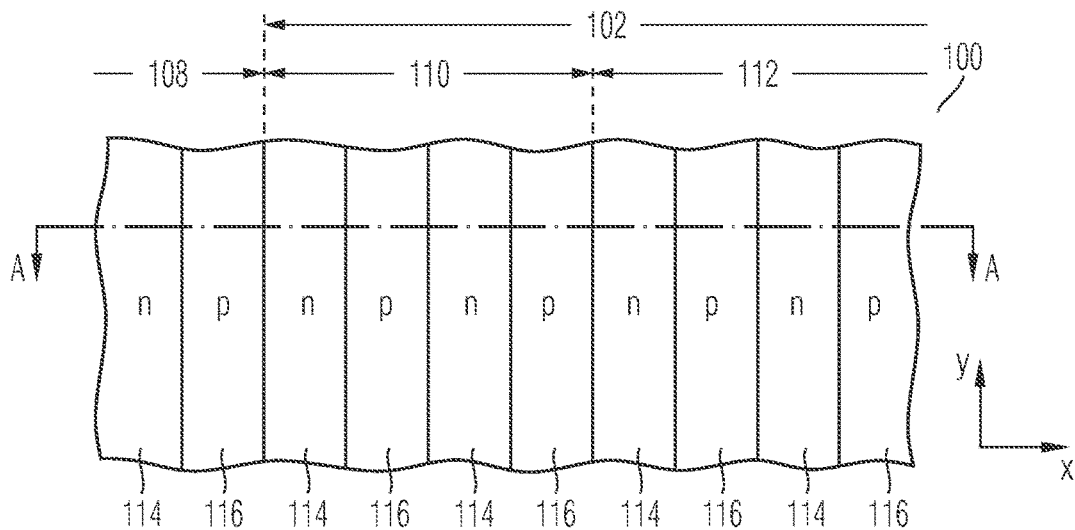
FIG. 1A is a schematic top view of an embodiment of a super-junction semiconductor device part including a transistor cell area and a junction termination area.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", an and the are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuits or secrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Al, W, Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

An embodiment of a super-junction semiconductor device part is illustrated in the schematic top view 100 of FIG. 1A.

Figure 1B:
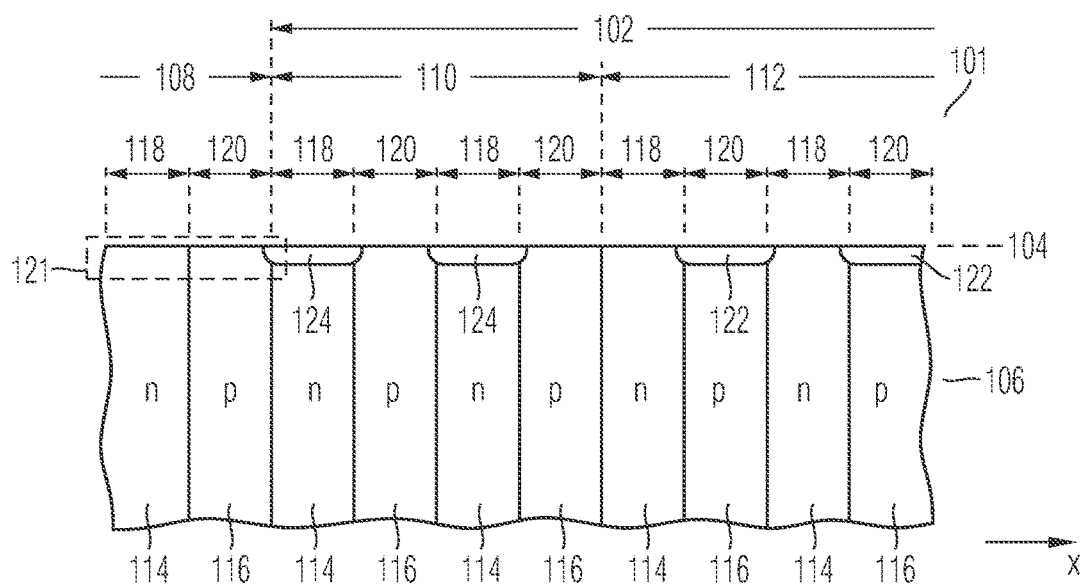
FIG. 1B is a schematic cross-sectional view of the super-junction semiconductor device part of FIG. 1 along cut-line A-A.

A schematic cross-sectional view 101 along cut line A-A of FIG. 1A is illustrated in FIG. 1B.

The SJ semiconductor device includes a junction termination area 102 at a first surface 104 of a semiconductor body 106 at least partly surrounding an active cell area 108. An inner part 110 of the junction termination area 102 is arranged between an outer part 112 of the junction termination area 102 and the active cell area 108. A charge compensation device structure comprising first regions 114 of the first conductivity type and second regions 116 of the second conductivity type is disposed alternately along a first lateral direction x.

First surface areas 118 correspond to a projection of the first regions 114 onto the first surface 104. Second surface areas 120 correspond to a projection of the second regions 116 onto the first surface 104. First dopants of the first conductivity type constitute a first junction termination extension structure 122 adjoining the first surface 104 in the outer part 112 of the junction termination area 102. A projection area of the first junction termination extension structure 122 onto the first surface 104 is at least partly included in the second surface areas 120 and is at least partly excluded from the first surface areas 118. Second dopants of the second conductivity type constitute a second junction termination extension structure 124. In the inner part 110 of the junction termination area 102, a projection area of the second junction termination extension structure 124 onto the first surface 104 is at least partly included in the first surface areas 118 and is at least partly excluded from the second surface areas 120.

The first junction termination extension structure 122 may abut the first surface 104 or be buried in the semiconductor body 106 below the first surface 104. Likewise, the second junction termination extension structure 122 may abut the first surface 104 or be buried in the semiconductor body 106 below the first surface 104. Burying the first and/or second junction termination extension structures 122, 124 in the semiconductor body 106 may be carried out by a deep ion implantation process and/or by forming one or more epitaxial layer(s) on the first and/or second junction termination extension structures 122, 124. The charge compensation device structure may abut or be spaced apart from the first surface 104 in the junction termination area 102.

In the active cell area 108, further semiconductor elements, for example source regions, body regions, gate dielectrics, gate electrodes may be arranged at the first surface in an area 121.

In some embodiments, the second dopants are absent in the outer part 112 of the junction termination area 102. In other words, the second junction termination extension structure 124 is absent in the outer part 112 of the junction termination area 102.

In some embodiments, the first dopants are absent in the inner part 110 of the junction termination area 102. In other words, the first junction termination extension structure 122 is absent in the inner part 110 of the junction termination area 102.

In some embodiments, the charge compensation device structure and the first junction termination extension structure 122 are absent in the outer part 112 of the junction termination area 102. The charge compensation device structure may be replaced by an intrinsic, lightly p- or lightly n-doped region, for example corresponding to a part of an epitaxial layer or substrate serving as a drift zone in the active cell area 108.

In some embodiments, the charge compensation device structure and the second junction termination extension structure 124 are absent in the inner part 110 of the junction termination area 102. The charge compensation device structure may be replaced by an intrinsic, lightly p- or lightly n-doped region, for example corresponding to a part of an epitaxial layer or substrate serving as a drift zone in the active cell area 108.

In some embodiments, a dose of the second dopants constituting the second junction termination extension structure 124 ranges between $5 \times 10^{11}$ cm$^{-2}$ and $5 \times 10^{12}$ cm$^{-2}$.

In some embodiments, a dose of the first dopants constituting the first junction termination extension structure 122 ranges between $5 \times 10^{11}$ cm$^{-2}$ and $5 \times 10^{12}$ cm$^{-2}$.

In some embodiments, an element of the first dopants and an element of the dopants constituting the first regions 114 are different.

In some embodiments, an element of the second dopants and an element of the dopants constituting the second regions 116 are different.

Examples n-type dopants in silicon include phosphorous (P), arsenic (As), and antimony (Sb). Examples of p-type dopants in silicon include boron (B), gallium (Ga), and aluminum (Al).

In some embodiments the charge compensation device structure including the first and second regions 114, 116 is formed by multi-epitaxial growth technology. In some other embodiments, the charge compensation device structure including the first and second regions 114, 116 is formed by deep trench technology. In yet other embodiments, a combination of multi-epitaxial growth technology and deep trench technology is used to form the charge compensation device structure. For example, a lower part of the charge compensation device structure may be formed by the deep trench technology and an upper part of the charge compensation device structure may be formed by the multi-epitaxial growth technology. Also the lower part of the charge compensation device structure may be formed by the multi-epitaxial growth technology and an upper part of the charge compensation device structure may be formed by the deep trench technology.

A width of the first and/or second regions 114, 116 along the lateral direction x may be constant or vary in the junction termination area 102, for example decrease with increasing distance from the active cell area 108.

An embodiment of a super-junction semiconductor device is illustrated in another part in the schematic top view 200 and the schematic cross sectional views 201, 202 along the cut lines B-B and C-C.

Similar to the SJ semiconductor device illustrated in FIGS. 1A and 1B, in the SJ semiconductor device illustrated in top view 200 and cross sectional views 201, 202, the projection area of the first junction termination extension structure 122 onto the first surface 104 in the outer part 112 of the junction termination area 102 is at least partly included in the second surface areas 120 and is at least partly excluded from the first surface areas 118. In the inner part 110 of the junction termination area 102, a projection area of the second junction termination extension structure 124 onto the first surface 104 is at least partly included in the first surface areas 118 and is at least partly excluded from the second surface areas 120.

Figure 3:
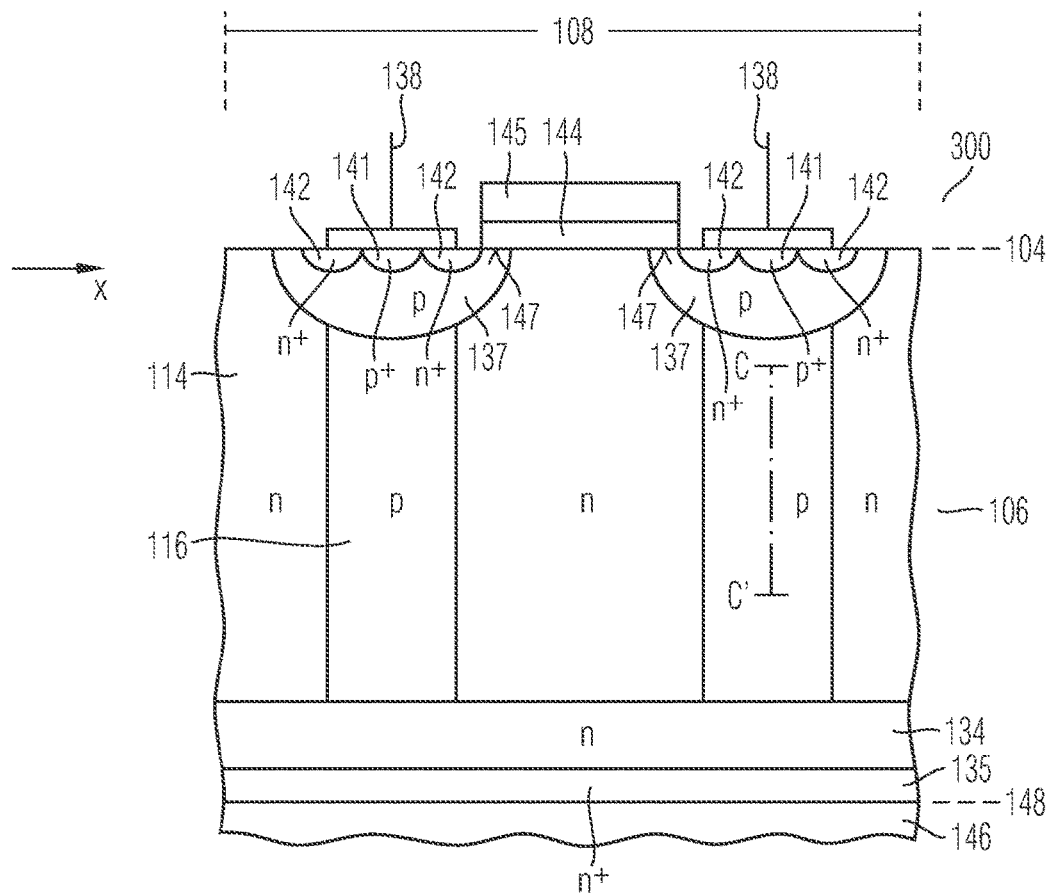
FIG. 3 is a schematic cross-sectional view of SJ transistor cells being an example of a SJ transistor type.

An embodiment of SJ transistor elements in the area 121 of the active cell area 108 of FIG. 1B is illustrated in the cross-sectional view 300 of FIG. 3. The SJ semiconductor device is a vertical super junction (SJ) n-channel field-effect transistor (NFET). The vertical SJ NFET includes an optional n-doped field stop or buffer zone 134 between the first and second regions 114, 116 of the charge compensation device structure and an n$^+$-doped drain region 135. Each one of the second regions 116 in the active cell area 108 adjoins a bottom side of a p-doped body region 137. The p-doped body region 137 is electrically coupled to a source contact 138 at the first surface 104 of the semiconductor body 106 via an optional p$^+$-doped body contact region 141. N$^+$-doped source regions 142 adjoin the first surface 104 and are electrically coupled to the source contact 138. A gate structure including a gate dielectric 144 and a gate electrode 145 is arranged on the semiconductor body 106 at the first surface 104 and is configured to control a conductivity in a channel region 147 by field effect. Thereby, a current flow between the source contact 138 at the first surface 104 and a drain contact 146 at a second side 148 can be controlled. The source and drain contacts 138, 146 may include conductive materials such as metal(s) and/or highly doped semiconductor material(s).

The vertical SJ NFET illustrated in FIG. 3 is one example of a SJ semiconductor device including the charge compensation device structure. Other embodiments may include vertical SJ p-channel FETs, lateral SJ FETs including source and drain contacts at a common side, lateral or vertical SJ insulated gate bipolar transistors (SJ IGBTs), for example.

Figure 4:
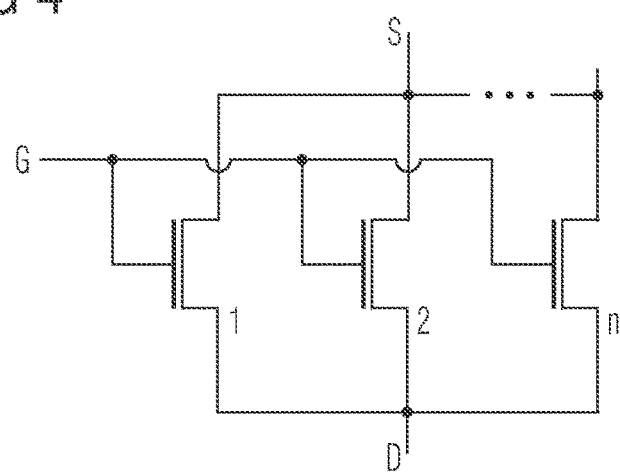
FIG. 4 is a schematic circuit diagram of a parallel connection of SJ transistor cells.

Transistor cells of the vertical SJ NFET illustrated in FIG. 3 are electrically connected in parallel as is illustrated in the schematic circuit diagram of FIG. 4. A parallel connection is achieved by interconnecting source electrodes of the transistor cells 1 . . . n to a common source contact S, by interconnecting gate electrodes of the transistor cells 1 . . . n to a common gate contact G, and by interconnecting drain electrodes of the transistor cells 1 . . . n to a common drain contact D.

A number of first and second regions 114, 116 in the embodiments illustrated above may be different, i.e. smaller or larger than the specific number illustrated with respect to each of the inner part 110, the intermediate part 111, and the outer part 112.

Figure 5A:
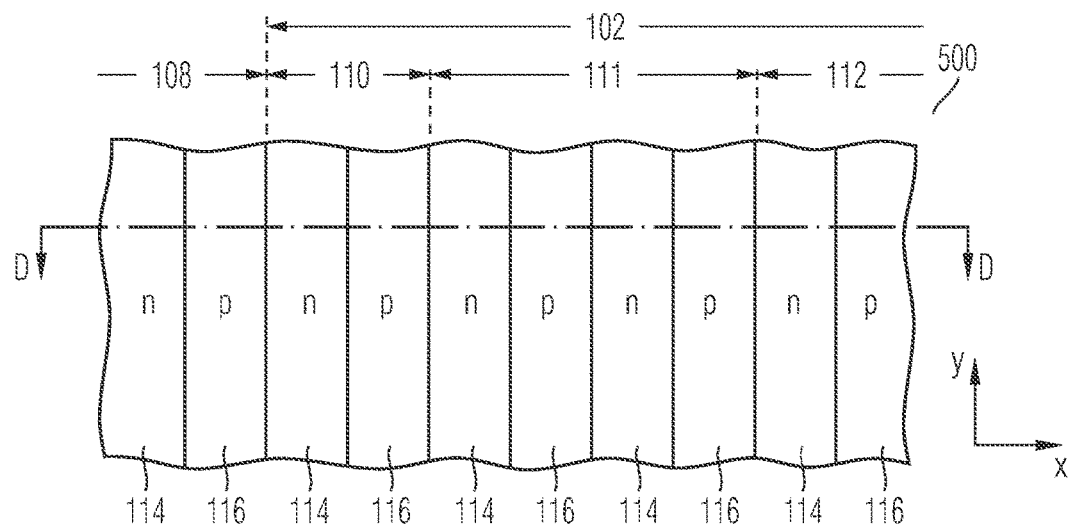
FIG. 5A is a schematic top view of an embodiment of a super-junction semiconductor device part including a transistor cell area and a junction termination area.

An embodiment of a super-junction semiconductor device part is illustrated in the schematic top view 500 of FIG. 5A.

Figure 5B:
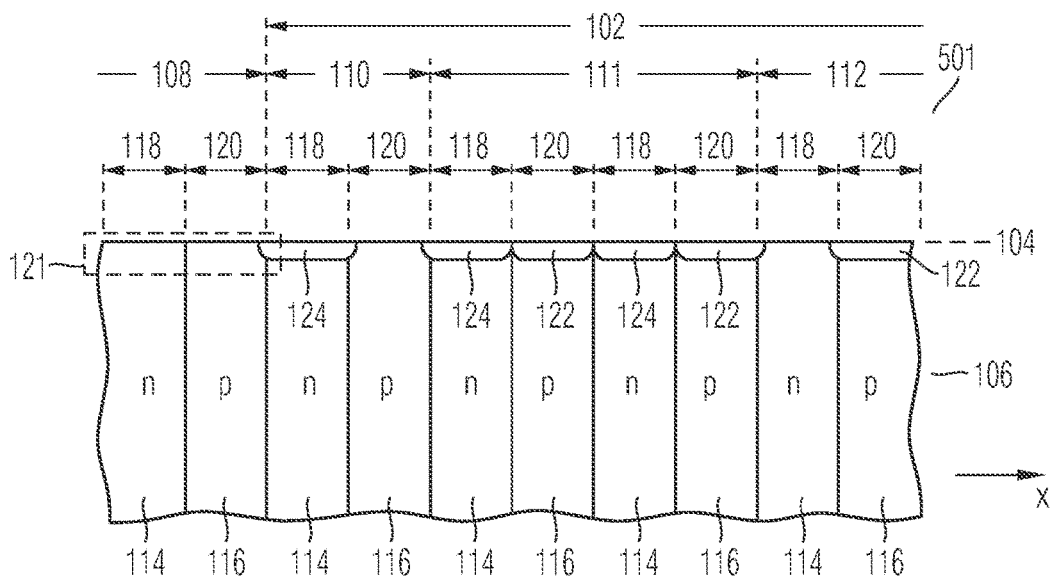
FIG. 5B is a schematic cross-sectional view of the super-junction semiconductor device part of FIG. 5A along cut-line D-D.

A schematic cross-sectional view 501 along cut line D-D of FIG. 5A is illustrated in FIG. 5B.

In addition to the SJ semiconductor device illustrated in FIGS. 1A, 1B, the SJ semiconductor device illustrated in the schematic top view 500 of FIG. 5A further comprises an intermediate part 111 of the junction termination area 102, the intermediate part 111 being arranged between the outer and inner parts 112, 110 of the junction termination area 102. In the intermediate part 111 of the junction termination area 102, a projection area of the first junction termination extension structure 122 onto the first surface 104 is at least partly included in the second surface areas 120 and is at least partly excluded from the first surface areas 118, and a projection area of the second junction termination extension structure 124 onto the first surface 104 is at least partly included in the first surface areas 118 and is at least partly excluded from the second surface areas 120.

Figure 2:
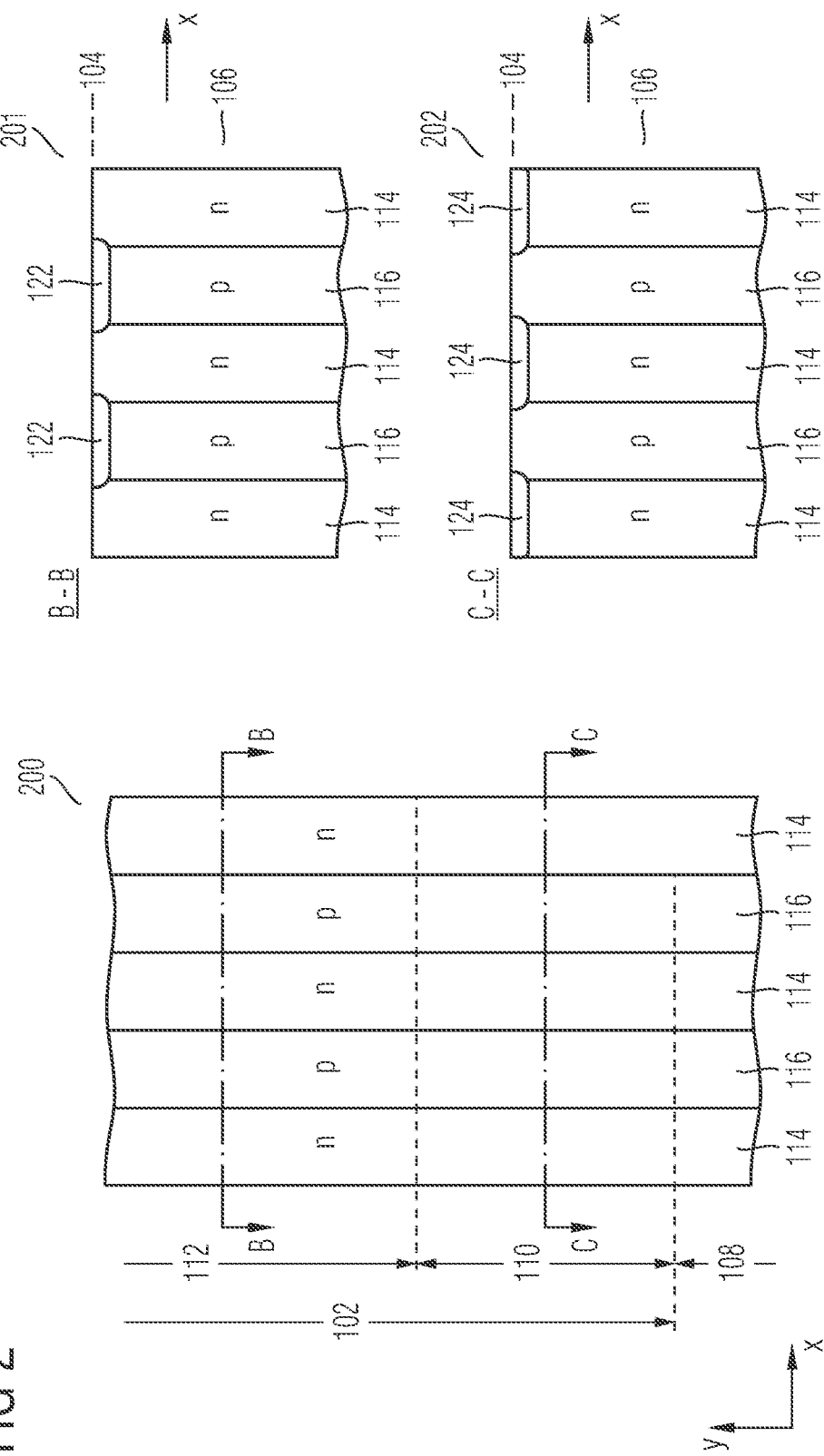
FIG. 2 illustrates a schematic top view and cross sectional views of an embodiment of a super-junction semiconductor device part including a transistor cell area and a junction termination area.
Figure 6:
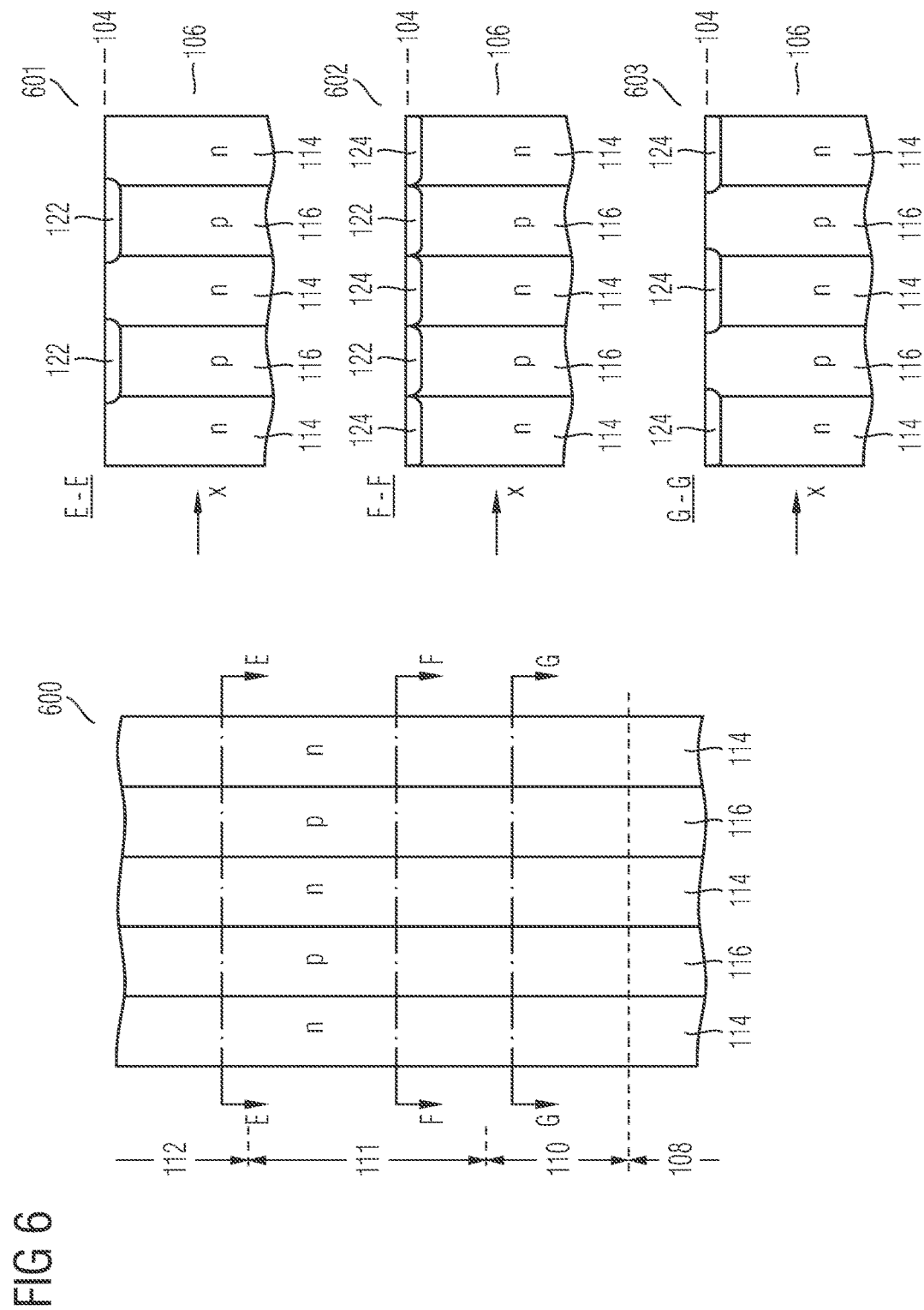
FIG. 6 illustrates a schematic top view and cross sectional views of an embodiment of a super-junction semiconductor device part including a transistor cell area and a junction termination area.

Similar to the SJ semiconductor device illustrated in FIGS. 5A and 5B, in the SJ semiconductor device illustrated in top view 600 of FIG. 6, in addition to the top view 200 and cross-sectional views 201, 202 of the SJ semiconductor device part illustrated in FIG. 2, the junction termination area 102 further includes the intermediate part 111. A cross sectional-view 601 is taken along cut line E-E in the outer part 112 of the junction termination area 102. A cross sectional-view 602 is taken along cut line F-F in the intermediate part 111 of the junction termination area 102. A cross sectional-view 603 is taken along cut line G-G in the inner part 110 of the junction termination area 102.

Similar to the intermediate part 111 of the junction termination area 102 of the cross-sectional view 501 of FIG. 5B, in the cross-sectional view 602 of the intermediate part 111 of the SJ semiconductor device part illustrated in FIG. 6, a projection area of the first junction termination extension structure 122 onto the first surface 104 is at least partly included in the second surface areas 120 and is at least partly excluded from the first surface areas 118, and a projection area of the second junction termination extension structure 124 onto the first surface 104 is at least partly included in the first surface areas 118 and is at least partly excluded from the second surface areas 120.

According to the embodiments above, the first and second regions 114, 116 of the charge compensation structure extend in parallel as stripes along a second lateral direction y. According to another embodiment, the first regions 114 are separate pillars of the first conductivity type or islands of the first conductivity type surrounded by the second regions 116 constituting a continuous region of the second conductivity type with respect to a top view. According to another embodiment, the second regions 116 are separate pillars or islands of the second conductivity type surrounded by the first regions 114 constituting a continuous region of the first conductivity type with respect to a top view. A top view of the first regions 114 or the second regions 116 may be square-shaped, rectangular, circular, polygonal, or ellipsoidal. Examples of shapes are illustrated in the schematic top views of FIG. 7.

Figure 8:
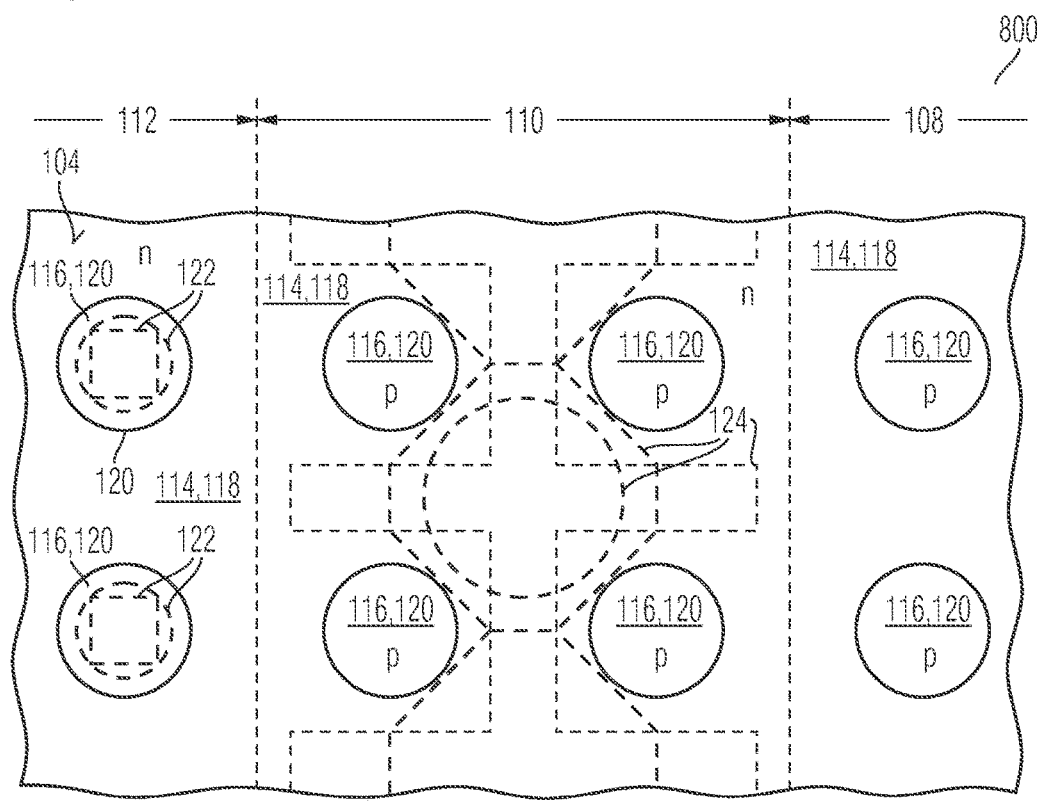
FIG. 8 is a is a schematic top view of an embodiment of a super-junction semiconductor device part including circular charge compensation regions.

An embodiment of a super-junction semiconductor device part including circular second regions 116 is illustrated in the schematic top view 800 of FIG. 8.

The circular second regions 116 are surrounded by a continuous first region 114 extending from the active cell area 108, through the inner part 110 of the junction termination area 102 and through the outer part 112 of the junction termination area 102.

Figure 7:
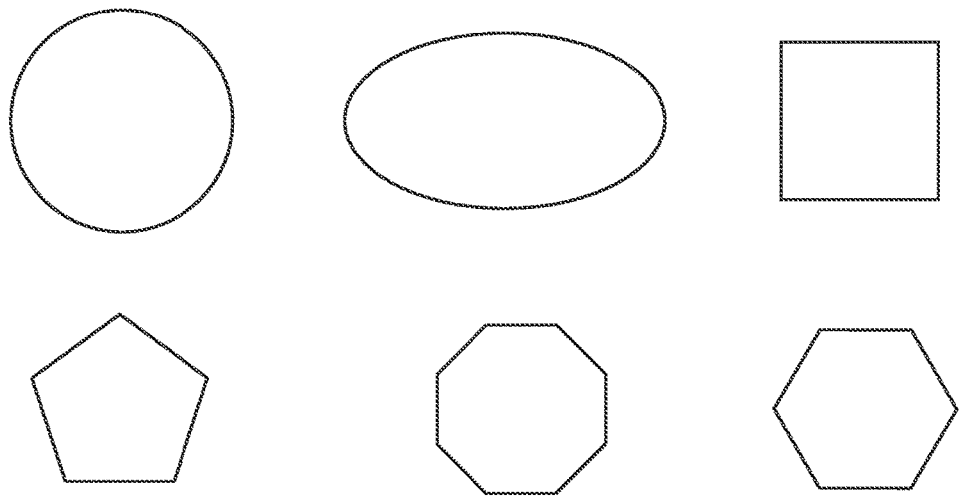
FIG. 7 is a schematic illustration of top views of shapes of p- or n-doped charge compensation regions.

The projection area of the first junction termination extension structure 122 onto the first surface 104 in the outer part 112 of the junction termination area 102 is at least partly included in the second surface areas 120 and is at least partly excluded from the first surface areas 118. The projection area of the first junction termination extension structure 122 onto the first surface 104 is exemplary illustrated as a circular and as a square area. According to other embodiments, other shapes may be used or combined. Some further examples of shapes are illustrated in FIG. 7. Other shapes may be applied.

In the inner part 110 of the junction termination area 102, a projection area of the second junction termination extension structure 124 onto the first surface 104 is at least partly included in the first surface areas 118 and is at least partly excluded from the second surface areas 120. The projection area of the second junction termination extension structure 124 onto the first surface 104 is exemplary illustrated as circular, polygonal and crosswise areas. According to other embodiments, other shapes may be used or combined. Some further examples of shapes are illustrated in FIG. 7. Other shapes may be applied.

Figure 9:
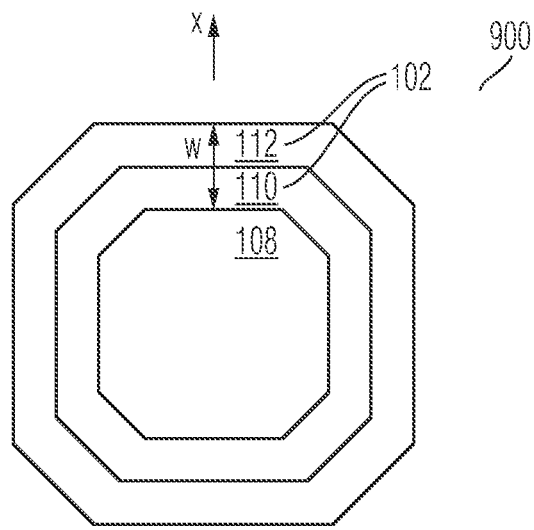
FIG. 9 is a top view of a SJ semiconductor device including an active cell area that is completely surrounded by a junction termination area.

An embodiment of a SJ semiconductor device is illustrated in the schematic top view 900 of FIG. 9. The active cell area 108 is completely surrounded by the junction termination area 102.

In some embodiments, an extension w of the junction termination area along the lateral direction x ranges between 30 μm and 1000 μm.

Figure 10:
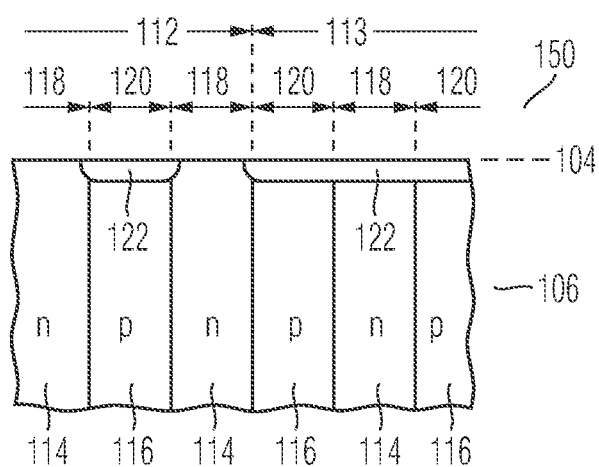
FIG. 10 is a schematic cross-sectional area of an embodiment of a junction termination extension structure.

An embodiment of a SJ semiconductor device is illustrated in the cross-sectional view 150 of FIG. 10.

The SJ further semiconductor device comprises an outermost part 113 of the junction termination area 102. The outer part 112 is arranged between the outermost part 113 and the inner part 110. In the outermost part 113 of the junction termination area 102, a projection area of the first junction termination extension structure 122 onto the first surface 104 is at least partly included in the second surface areas and is at least partly included in the first surface areas.

Embodiments described herein provide the technical benefit of a smoother transition between p-doped junction termination areas and n-doped junction termination areas leading to a decreased electric field peak strength in the junction termination area 102 in a blocking voltage operation of the SJ semiconductor device.

Figure 11:
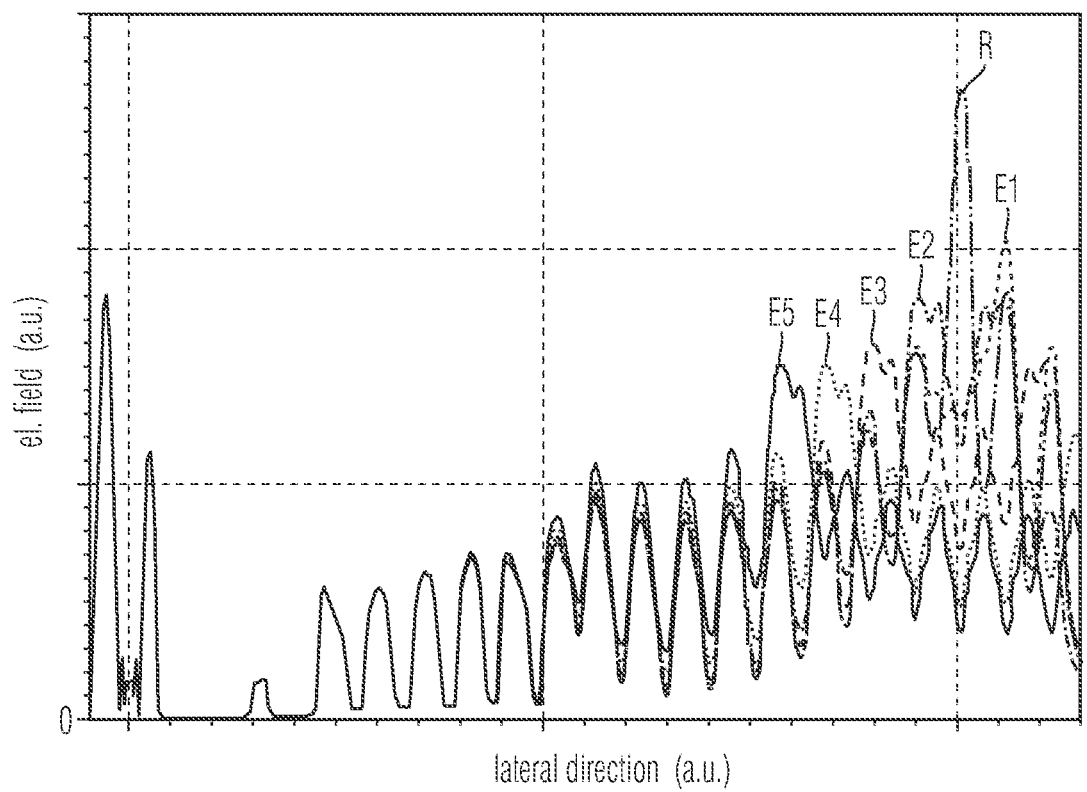
FIG. 11 is a graph illustrating electric field profiles at a surface of a SJ semiconductor device along a lateral direction from an active cell area through a junction termination area.

In the graph of FIG. 11, simulated profiles of an electric field at the first surface 104 of SJ semiconductor devices are illustrated along a lateral direction from the active cell area 108 through the junction termination area 102.

Curve R denotes a SJ semiconductor device without an interruption of the first junction termination extension structure 122 in the outer part 112 of the junction termination area 102 and without an interruption of the second junction termination extension structure 124 in the inner part 110 of the junction termination area 102.

Electric field curves associated with embodiments described above are denoted E1, E2, E3, E4, E5 and allow for a reduction of the electric field peak in the junction termination area 102, the curves differing with regard to a width of the intermediate part 111 of the junction termination area 102.

Figure 12:
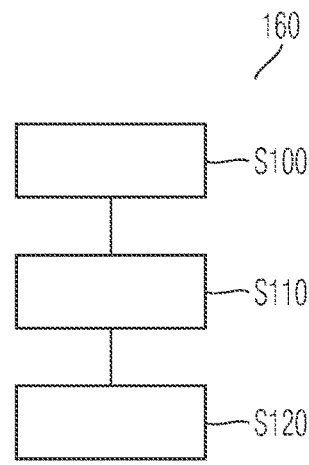
FIG. 12 is a schematic flow diagram for illustrating a method of manufacturing a SJ semiconductor device.

FIG. 12 is a schematic flow diagram for illustrating a method 160 of manufacturing a SJ semiconductor device.

It will be appreciated that while method 160 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 includes forming a charge compensation device structure in a semiconductor body, the charge compensation device structure comprising first regions of the first conductivity type and second regions of the second conductivity type disposed alternately along a first lateral direction, first surface areas corresponding to a projection of the first regions onto the first surface, and second surface areas corresponding to a projection of the second regions onto the first surface. In some other embodiments, the charge compensation device structure including the first and second regions is formed by deep trench technology. In yet other embodiments, a combination of multi-epitaxial growth technology and deep trench technology is used to form the charge compensation device structure. For example, a lower part of the charge compensation device structure may be formed by the deep trench technology and an upper part of the charge compensation device structure may be formed by the multi-epitaxial growth technology. Also the lower part of the charge compensation device structure may be formed by the multi-epitaxial growth technology and an upper part of the charge compensation device structure may be formed by the deep trench technology.

Process feature S110 includes forming a first mask on the first surface, the first mask at least partly exposing the second surface areas and at least partly covering the first surface areas in an outer part of a junction termination area at least partly surrounding an active area. The mask may be formed by lithographic patterning a hard and/or resist mask, for example.

Process feature S120 includes introducing dopants of the first conductivity type into the semiconductor body through the at least partly exposed second surface areas. The dopants may be introduced by ion implantation and/or diffusion, for example.

In some other embodiments, process feature S110 includes forming a second mask on the first surface, the second mask at least partly exposing the first surface areas and at least partly covering the second surface areas in an inner part of a junction termination area between the outer part and an active cell area. The mask may be formed by lithographic patterning a hard and/or resist mask, for example. Process feature S120 may include introducing dopants of the second conductivity type into the semiconductor body through the at least partly exposed first surface areas. The dopants may be introduced by ion implantation and/or diffusion, for example.

Figure 13:
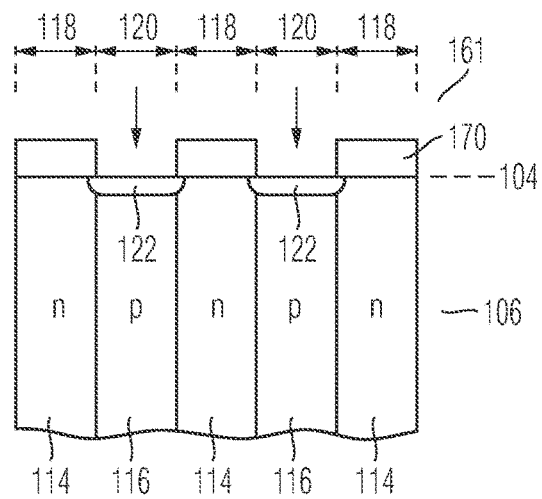
FIG. 13 is a schematic cross-sectional view of a semiconductor body for illustrating a method of manufacturing a first junction termination extension structure of a SJ semiconductor device.

Referring to the schematic cross-sectional view of FIG. 13, dopants of the first conductivity type are introduced into the semiconductor body 106 through the at least partly exposed second surface areas 120 in the outer part 112 at the first surface 104. The second surface areas 120 are at least partly exposed by a patterned first mask 170, for example a lithographically patterned hardmask and/or resist mask. The dopants may be introduced by ion implantation and/or diffusion and constitute the first junction termination extension structure 122.

Figure 14:
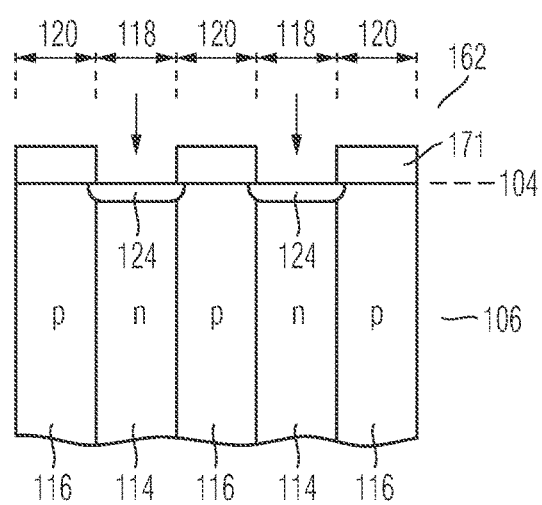
FIG. 14 is a schematic cross-sectional view of a semiconductor body for illustrating a method of manufacturing a second junction termination extension structure of a SJ semiconductor device.

Referring to the schematic cross-sectional view of FIG. 14, a second mask 171 is formed on the first surface 104, for example a patterned hardmask and/or resist mask. The second mask 171 at least partly exposes the first surface areas 118 and at least partly covers the second surface areas 120 in the inner part 110 of the junction termination area 102. Dopants of the second conductivity type are introduced into the semiconductor body 106 through the at least partly exposed first surface areas 118. The dopants may be introduced by diffusion and/or ion implantation and constitute the second junction termination extension structure 124.

Figure 15A:
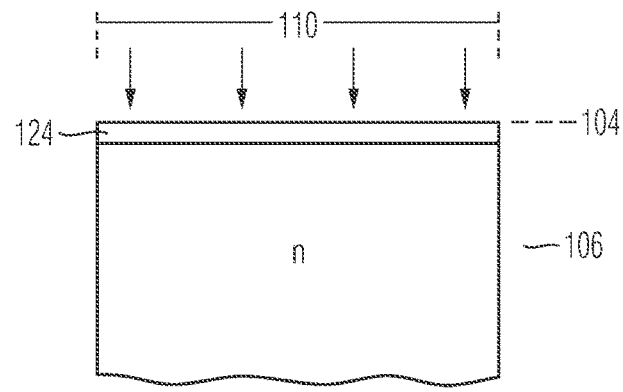
FIGS. 15A to 15C are schematic cross-sectional views for illustrating another method of manufacturing a second junction termination extension structure of a SJ semiconductor device.
Figure 15B:
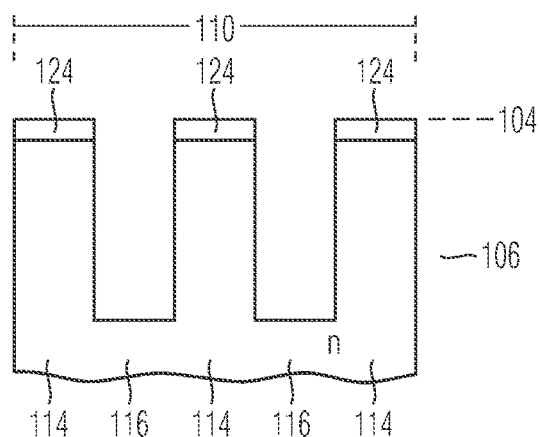
Figure 15C:
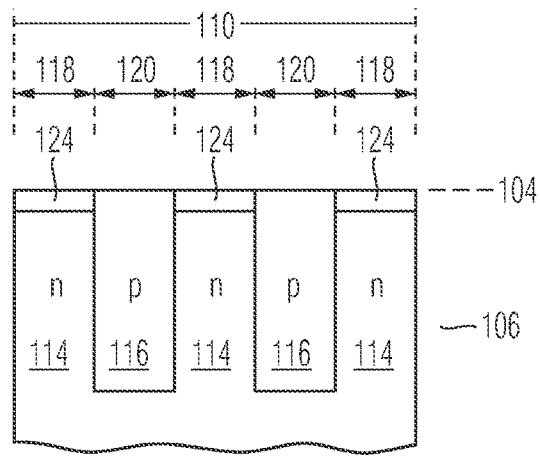

Another embodiment of forming the second junction termination extension structure 124 is illustrated in the schematic cross-sectional views of FIGS. 15A to 15C.

Referring to the schematic cross-sectional view of FIG. 15A, dopants of the second conductivity type are introduced into the semiconductor body 106 in the inner part 110 of the junction termination area 102, for example by diffusion and/or ion implantation and constitute the second junction termination extension structure 124.

Referring to the schematic cross-sectional view of FIG. 15B, trenches are formed into the semiconductor body 106 from the first surface 104, wherein a part of the trenches are located in the inner part 110, thereby removing part of the dopants of the second conductivity type introduced beforehand. The trenches may be formed by an appropriate etch process, for example dry etching such as reactive ion etching.

Referring to the schematic cross-sectional view of FIG. 15C, the second regions 116 of the second conductivity type are formed in the trenches, for example by an epitaxial growth process. Due to partial removal of the dopants of the second conductivity type by formation of the trenches, the second junction termination extension structure 124 is absent in a projection area of the second regions 116 onto the first surface 104.

Additional processes may be carried out after, before, between or together with processes described above. The additional processes may include formation of source, drain gate, contacts, dielectrics, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A super-junction semiconductor device, comprising:
a junction termination area at a first surface of a semiconductor body and at least partly surrounding an active cell area, wherein an inner part of the junction termination area is arranged between an outer part of the junction termination area and the active cell area;
a charge compensation device structure comprising first regions of a first conductivity type and second regions of a second conductivity type disposed alternately along a first lateral direction, first surface areas corresponding to a projection of the first regions onto the first surface, and second surface areas corresponding to a projection of the second regions onto the first surface; and
at least one of a first junction termination extension structure and a second junction termination extension structure, wherein first dopants of the first conductivity type constitute the first junction termination extension structure, wherein, in the outer part of the junction termination area, a projection area of the first junction termination extension structure onto the first surface is at least partly included in the second surface areas and is at least partly excluded from the first surface areas, and second dopants of the second conductivity type constitute the second junction termination extension structure, wherein, in the inner part of the junction termination area, a projection area of the second junction termination extension structure onto the first surface is at least partly included in the first surface areas and is at least partly excluded from the second surface areas.

2. The super-junction semiconductor device of claim 1, wherein the second dopants are absent in the outer part of the junction termination area.

3. The super-junction semiconductor device of claim 1, wherein the first dopants are absent in the inner part of the junction termination area.

4. The super-junction semiconductor device of claim 1, wherein the charge compensation device structure and the first junction termination extension structure are absent in the outer part of the junction termination area.

5. The super-junction semiconductor device of claim 1, wherein the charge compensation device structure and the second junction termination extension structure are absent in the inner part of the junction termination area.

6. The super-junction semiconductor device of claim 1, wherein an intermediate part of the junction termination area is arranged between the outer and inner parts of the junction termination area, and wherein, in the intermediate part of the junction termination area, a projection area of the first junction termination extension structure onto the first surface is at least partly included in the second surface areas and is at least partly excluded from the first surface areas, and a projection area of the second junction termination extension structure onto the first surface is at least partly included in the first surface areas and is at least partly excluded from the second surface areas.

7. The super-junction semiconductor device of claim 1, wherein an element of the first dopants and an element of the dopants constituting the first regions are different.

8. The super-junction semiconductor device of claim 1, wherein an element of the second dopants and an element of the dopants constituting the second regions are different.

9. The super-junction semiconductor device of claim 1, wherein source regions electrically connected by contacts at the first surface in the active cell area are absent in the junction termination area.

10. The super-junction semiconductor device of claim 1, further comprising:
a source contact at the first surface and electrically connected to a source region in the semiconductor body; and
a drain contact at a second surface of the semiconductor body opposite to the first surface, the drain contact being electrically connected to a drain region in the semiconductor body.

11. The super-junction semiconductor device of claim 1, wherein the active cell area is completely surrounded by the junction termination area.

12. The super-junction semiconductor device of claim 1, wherein the active cell area comprises a plurality or transistor cells connected in parallel.

13. The super-junction semiconductor device of claim 1, wherein an extension of the junction termination area along the lateral direction ranges between 30 μm and 1000 μm.

14. The super-junction semiconductor device of claim 1, wherein a dose of the second dopants ranges between $5\times10^{11}$ cm$^{-2}$ and $5\times10^{12}$ cm$^{-2}$.

15. The super-junction semiconductor device of claim 1, wherein the junction termination area has an outermost part, wherein the outer part is arranged between the outermost part and the inner part, and wherein, in the outermost part of the junction termination area, a projection area of the first junction termination extension structure onto the first surface is at least partly included in the second surface areas and is at least partly included in the first surface areas.

* * * * *